(12) United States Patent
Kim et al.

(10) Patent No.: US 11,864,405 B2
(45) Date of Patent: Jan. 2, 2024

(54) DISPLAY DEVICE INCLUDING A SECOND ELECTRODE THAT CONTACTS AN AUXILIARY ELECTRODE AT A SIDE SURFACE THEREOF

(71) Applicant: Samsung Display Co., Ltd., Yongin-si (KR)

(72) Inventors: Sang Gyun Kim, Hwaseong-si (KR); Il Soo Oh, Seoul (KR); Bo Ra Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 176 days.

(21) Appl. No.: 17/403,897

(22) Filed: Aug. 17, 2021

(65) Prior Publication Data

US 2022/0149316 A1    May 12, 2022

(30) Foreign Application Priority Data

Nov. 10, 2020  (KR) ........................ 10-2020-0149697

(51) Int. Cl.
| | | |
|---|---|---|
| H01L 29/08 | (2006.01) | |
| H10K 50/824 | (2023.01) | |
| H10K 50/15 | (2023.01) | |
| H10K 59/124 | (2023.01) | |
| H10K 71/00 | (2023.01) | |

(52) U.S. Cl.
CPC ......... *H10K 50/824* (2023.02); *H10K 50/157* (2023.02); *H10K 59/124* (2023.02); *H10K 71/00* (2023.02)

(58) Field of Classification Search
CPC .. H10K 50/824; H10K 50/157; H10K 59/124; H10K 71/00
USPC .......................................................... 257/40
See application file for complete search history.

(56) References Cited

U.S. PATENT DOCUMENTS

| | | |
|---|---|---|
| 7,098,474 B2 | 8/2006 | Kanno et al. |
| 8,338,223 B2 | 12/2012 | Lee et al. |
| 10,403,861 B2 | 9/2019 | Lee et al. |
| 10,714,548 B2 * | 7/2020 | Kim ................. H10K 59/131 |
| 2015/0001477 A1 * | 1/2015 | Namkung ........... H10K 59/124 257/40 |
| 2020/0212356 A1 * | 7/2020 | Kim ................. H10K 59/122 |
| 2020/0321421 A1 * | 10/2020 | Jeon ................. H10K 59/123 |

FOREIGN PATENT DOCUMENTS

| | | | | |
|---|---|---|---|---|
| KR | 10-0865445 | | 10/2008 | |
| KR | 10-1000620 | | 12/2010 | |
| KR | 20150075668 A | * | 7/2015 | ............. H10K 59/12 |
| KR | 10-1574152 | | 12/2015 | |
| KR | 10-2016-0062646 | | 6/2016 | |
| KR | 10-2016-0074333 | | 6/2016 | |

(Continued)

*Primary Examiner* — Phuc T Dang
(74) *Attorney, Agent, or Firm* — H.C. Park & Associates, PLC

(57) ABSTRACT

A display device includes: a substrate; a transistor that is disposed on the substrate; an auxiliary electrode that is connected with the transistor; a first electrode that is disposed on a same layer as the auxiliary electrode; a light emitting diode layer that is disposed on the first electrode; and a second electrode that is disposed on the light emitting diode layer, wherein the second electrode contacts the auxiliary electrode at a side surface thereof.

14 Claims, 15 Drawing Sheets

(56) References Cited

FOREIGN PATENT DOCUMENTS

| KR | 10-1787972 | 10/2017 | | |
|----|----|----|----|----|
| KR | 10-2019-0079954 | 7/2019 | | |
| KR | 20190079954 A | * | 7/2019 | ......... H10K 59/1213 |

* cited by examiner

DISPLAY DEVICE INCLUDING A SECOND ELECTRODE THAT CONTACTS AN AUXILIARY ELECTRODE AT A SIDE SURFACE THEREOF

CROSS-REFERENCE TO RELATED APPLICATION

This application claims priority from and the benefit of Korean Patent Application No. 10-2020-0149697, filed on Nov. 10, 2020, which is hereby incorporated by reference for all purposes as if fully set forth herein.

BACKGROUND

Field

Embodiments/implementations of the invention relate generally to a display device, and a method for manufacturing the display device.

Discussion of the Background

A display device is widely used as a display screen for a laptop computer, a tablet computer, a smart phone, a portable display device, and a portable information device, in addition to the display screen of a television or monitor.

Recently, research and development on display devices using light emitting elements have been in progress, and these display devices are in the spotlight as the next generation display because they have high image quality and high reliability. Such a display device is a self-luminous device, and has low power consumption, a high response speed, a high luminous efficiency, a high luminance, and a wide viewing angle. These display devices are mounted on electronic products or home appliances such as televisions, monitors, laptop computers, smart phones, tablet computers, electronic pads, wearable devices, watch phones, portable information devices, navigation devices, or vehicle control display devices, and are attracting attention as a next generation display that can be used as a display for such devices.

For high-speed driving of display devices, N-MOS driving, which has higher mobility than P-MOS driving, is drawing attention. However, in order to use N-MOS driving, there is an inconvenience of having to invert the structure of a light emitting element having a P-MOS structure of a display device to be driven.

The above information disclosed in this Background section is only for understanding of the background of the inventive concepts, and, therefore, it may contain information that does not constitute prior art.

SUMMARY

Devices constructed/methods according to embodiments of the invention are capable of providing a display device that enables high-speed driving of an N-MOS device by having a cathode connected with a transistor, such that a light emitting diode having a P-MOS structure of a display device to be driven by an N-MOS driving device does not have reversed, and a manufacturing method thereof for providing such a display device.

Embodiments are to provide a display device and a manufacturing method thereof that enable high-speed driving of an N-MOS device by connecting a cathode with a transistor without reversing the structure of a light emitting diode.

Additional features of the inventive concepts will be set forth in the description which follows, and in part will be apparent from the description, or may be learned by practice of the inventive concepts.

A display device according to an embodiment includes: a substrate; a transistor that is disposed on the substrate; an auxiliary electrode that is connected with the transistor; a first electrode that is disposed on a same layer as the auxiliary electrode; a light emitting diode layer that is disposed on the first electrode; and a second electrode that is disposed on the light emitting diode layer, wherein the second electrode contacts the auxiliary electrode at a side surface thereof.

An inner groove may be disposed at one edge of the auxiliary electrode, and the auxiliary electrode and the second electrode may contact in the inner groove.

The display device may further include an insulation layer that is disposed between the transistor and the first electrode, wherein the insulating layer may include an opening that overlaps the transistor and a protruding portion that protrudes at a position adjacent to the opening, and the auxiliary electrode may be disposed in the protruding portion and the opening.

A cross-section of the protruding portion of the insulating layer may be curved in a direction that is perpendicular to a plane of the substrate.

The transistor and the auxiliary electrode may contact each other in the opening of the insulating layer.

The light emitting diode layer may further include a hole transport layer, an emission layer, and an electron transport layer, the hole transport layer may be disposed between the emission layer and the first electrode, and the electron transport layer may be disposed between the emission layer and the second electrode.

The transistor may include a semiconductor layer, a gate electrode, a source electrode, and a drain electrode, and the semiconductor layer may be of an N-type.

The display device may further include a partitioning wall that is disposed on the first electrode, wherein the partitioning wall may further include a first opening that overlaps the first electrode, and a second opening that is disposed adjacent to the protruding portion of the insulating layer.

The light emitting diode layer may be disposed in the first opening and the second opening of the partitioning wall, and on a top surface of the partitioning wall between the first opening and the second opening, and the light emitting diode layer disposed in the second opening does may not contact the auxiliary electrode.

The second electrode may be disposed on the top surface of the light emitting diode layer, and the second electrode may directly contact the auxiliary electrode in the second opening.

A display device according to another embodiment includes: a substrate; a plurality of transistors that are disposed on the substrate; a plurality of auxiliary electrodes that are respectively connected with the plurality of transistors; a plurality of first electrodes that are disposed on the same layers as the plurality of auxiliary electrodes; a plurality of light emitting diode layers that are respectively disposed on the plurality of first electrodes; and a plurality of second electrodes each positioned in an island shape on each light emitting diode layer, wherein the plurality of second electrodes respectively contact the plurality of auxiliary electrodes at side surfaces thereof, and each of the plurality of first electrodes is connected with neighboring ones of the plurality of first electrodes.

The first electrode may receive a common voltage, and the second electrode may receive a pixel voltage.

The light emitting diode layer may further include a hole transport layer, an emission layer, and an electron transport layer, the hole transport layer may be disposed between the emission layer and the first electrode, and the electron transport layer may be disposed between the emission layer and the second electrode.

The transistor may include a semiconductor layer, a gate electrode, a source electrode, and a drain electrode, and the semiconductor layer may be of an N-type.

An inner groove may be disposed at one edge of the auxiliary electrode, and the auxiliary electrode and the second electrode may contact in the inner groove.

A manufacturing method of a display device according to an embodiment includes: preparing a substrate where a transistor is disposed; forming an insulating layer that includes an opening that overlaps the transistor and a protruding portion that is adjacent to the opening on the transistor; depositing a first electrode material on the insulating layer; forming a first electrode and an auxiliary electrode that contacts the transistor in the opening of the insulating layer by etching the first electrode material; forming a partitioning wall on the first electrode and the auxiliary electrode; forming an inner groove in the auxiliary electrode by etching the auxiliary electrode; forming an emission layer on the partitioning wall; and forming a second electrode on the emission layer, wherein the inner groove of the auxiliary electrode and the second electrode contact each other.

In the forming of the partitioning wall on the first electrode and the auxiliary electrode, the partitioning wall may further include a first opening the overlaps the first electrode and a second opening that is disposed adjacent to the protruding portion of the insulating layer, and the auxiliary electrode and the second electrode may contact each other in the second opening.

The auxiliary electrode and the emission layer may not contact each other in the second opening of the partitioning wall.

In the forming of the emission layer on the partitioning wall, a deposition angle of the emission layer material may be 40 degrees or more.

In the forming of the second electrode on the emission layer, a deposition angle of the second electrode material may be 20 degrees or less.

According to the embodiments to be described in detail hereinbelow, there is provided a display device that is provided with high-speed driving by way of an N-MOS device by connecting a cathode with a transistor without reversing the structure of a light emitting diode of the display device, and a manufacturing method thereof.

It is to be understood that both the foregoing general description and the following detailed description are and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION OF THE EMBODIMENTS

Figure 1:
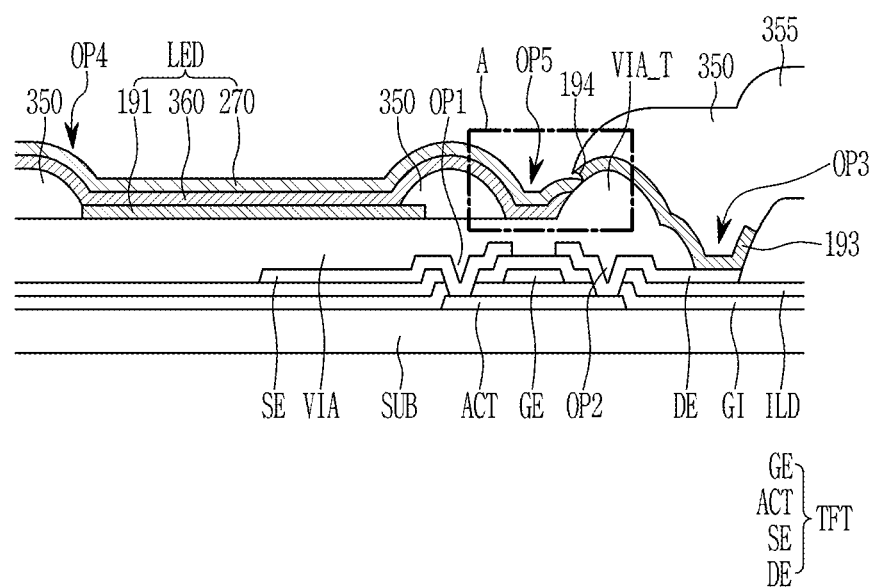
FIG. 1 schematically illustrates a cross-sectional view of a display device according to an embodiment that has been constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to an embodiment will be described with reference to the accompanying drawings.

FIG. 1 schematically illustrates a cross-sectional view of a display device according to an embodiment that has been constructed according to principles of the invention.

Referring to FIG. 1, a display device according to an embodiment includes a substrate SUB and a semiconductor layer ACT disposed on the substrate SUB.

The substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate SUB may be a rigid substrate, or a flexible substrate that can be bent, folded, or rolled. The substrate SUB may be single-layered or multi-layered. The substrate SUB may be alternately stacked with at least one base layer including a sequentially stacked polymer resin and at least one inorganic layer.

The semiconductor layer ACT may include one of amorphous silicon, polysilicon, and an oxide semiconductor. For example, the semiconductor layer ACT may include a semiconductor oxide material including a low temperature polysilicon (LTPS), or zinc (Zn), indium (In), gallium (Ga), and tin (Sn), or a mixture thereof. For example, the semiconductor layer may include an indium-gallium-zinc oxide (IGZO).

In the embodiment described herein, the semiconductor layer ACT may be an N-type with an electron as a carrier. In the case of an N-type semiconductor layer ACT, the mobility is higher than that of a P-type semiconductor, and thus it is advantageous for high speed driving.

A gate insulating layer GI may be disposed on the semiconductor layer ACT. The gate insulating layer GI may include a silicon oxide (SiOx), a silicon nitride (SiNx), and a silicon oxynitride (SiOxNy), and may have a single-layered or multi-layered structure.

A gate electrode GE may be disposed on the gate insulating layer GI. The gate electrode GE may overlap the semiconductor layer ACT in a direction that is perpendicular to a plane of the substrate SUB. The gate electrode GE may include molybdenum (Mo), aluminum (Al), copper (Cu), titanium (Ti), and a metal oxide, and may have a single-layered or multi-layered structure.

An interlayer insulating layer ILD may be disposed on the gate electrode GE. The interlayer insulating layer ILD may include a silicon oxide (SiOx), a silicon nitride (SiNx), and a silicon oxynitride (SiOxNy), and may have a single-layered or multi-layered structure. When the interlayer insulating layer ILD has a multi-layered structure containing a silicon nitride and a silicon oxide, a layer containing a silicon nitride may be disposed closer to the substrate SUB than a layer containing a silicon oxide.

The interlayer insulating layer ILD may include a first opening OP1 and a second opening OP2 overlapping the semiconductor layer ACT.

A data conductive layer including a source electrode SE and a drain electrode DE is disposed on the interlayer insulating layer ILD. The source electrode SE may contact the semiconductor layer ACT in the first opening OP1, and the drain electrode DE may contact the semiconductor layer ACT in the second opening OP2. The data conductive layer may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and a metal oxide thereof, and may have a single layered or multi-layered structure including the same.

The semiconductor layer ACT, the gate electrode GE, the source electrode SE, and the drain electrode DE form a transistor TFT. As described above, since the semiconductor layer ACT is an N-type, the transistor TFT may also be an N-MOS.

An insulating layer VIA may be disposed on the data conductive layer. The insulating layer VIA may include an organic insulating material such as a general purpose polymer such as polymethylmethacrylate (PMMA) or polystyrene (PS), a polymer derivative with a phenolic group, an acryl-based polymer, an imide polymer, polyimide, and a siloxane polymer.

The insulating layer VIA may include a third opening OP3 that overlaps the drain electrode DE. In addition, the insulating layer VIA includes a curved protruding portion VIA_T that is disposed adjacent to the third opening OP3. As will be described later, an auxiliary electrode 193 and a second electrode 270 may be in contact with the protruding portion VIA_T of the insulating layer VIA.

A first electrode 191 and the auxiliary electrode 193 are disposed on the insulating layer VIA. The first electrode 191 may be disposed on a flat portion of the insulating layer VIA. The auxiliary electrode 193 contacts the drain electrode DE in the third opening OP3 of the insulating layer VIA. The auxiliary electrode 193 may be formed along the protruding portion VIA_T of the insulating layer VIA from the third opening OP3.

The first electrode 191 and the auxiliary electrode 193 may include a metal such as silver (Ag), lithium (Li), calcium (Ca), aluminum (Al), magnesium (Mg), gold (Au), and the like, or may include a transparent conductive oxide (TCO) such as an indium tin oxide (ITO), an indium zinc oxide (IZO), and the like. The first electrode 191 may be formed of a single layer including a metallic material or a transparent conductive oxide, or multiple layers including them. For example, the first electrode 191 may have a triple layer structure of indium tin oxide (ITO)/silver (Ag)/indium tin oxide (ITO).

The first electrode 191 is connected with a first electrode 191 of a neighboring pixel, and may be a common electrode that receives a common voltage.

Figure 2:
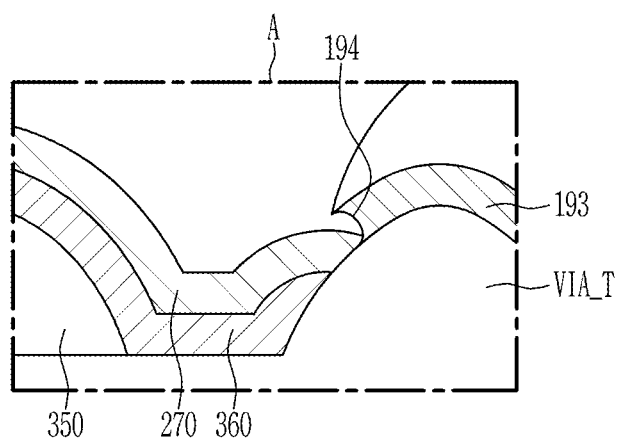
FIG. 2 is an enlarged view of the rectangular area marked by label A in FIG. 1.

FIG. 2 is an enlarged view of the rectangular area marked by label A in FIG. 1. Referring to FIG. 2, an inner groove 194 that is curved inwardly is formed in one edge of the auxiliary electrode 193 on the protruding portion VIA_T of the insulating layer VIA. That is, the cross-section of the edge of the auxiliary electrode 193 is not flat, and it may have a shape curved inwardly. The second electrode 270 may contact the auxiliary electrode 193 in the inner groove 194 of the auxiliary electrode 193.

Referring back to FIG. 1, a partitioning wall 350 is disposed on the first electrode 191 and the auxiliary electrode 193. The partitioning wall 350 includes a fourth opening OP4 overlapping the first electrode 191 in a direction that is perpendicular to a plane of the substrate SUB, and a fifth opening OP5 disposed adjacent to the protruding portion VIA_T of the insulating layer VIA. A part of the partitioning wall 350 may protrude in a direction that is away from the substrate SUB such that a spacer 355 may be formed.

A light emitting diode layer 360 is disposed on the first electrode 191 and the partitioning wall 350. The light emitting diode layer 360 may be disposed while contacting the first electrode 191 in the fourth opening OP4 of the partitioning wall 350, and may also be disposed on the partitioning wall 350 and thus it may be disposed in the fifth opening OP5 of the partitioning wall 350 as well. Referring to FIG. 1 and FIG. 2, the light emitting diode layer 360 does not contact the auxiliary electrode 193 in the fifth opening OP5 of the partitioning wall 350.

This will be described separately later, but due to a thermal deposition angle of an organic material in the deposition process of the light emitting diode layer 360, the light emitting diode layer 360 is formed so as to not contact the auxiliary electrode 193.

Next, referring to FIG. 1 and FIG. 2, the second electrode 270 is disposed on the light emitting diode layer 360. The second electrode 270 is formed in the top surface of the light emitting diode layer 360, and is formed in the fifth opening OP5 of the insulating layer VIA.

The second electrode 270 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), and lithium (Li), or a transparent conductive oxide (TCO) such as an indium tin oxide (ITO) and an indium zinc oxide (IZO).

The first electrode 191, the light emitting diode layer 360, and the second electrode 270 form a light emitting diode LED.

Referring to FIG. 2, the second electrode 270 contacts the auxiliary electrode 193 in the fifth opening OP5 of the insulating layer VIA. That is, although it will be described separately later, the second electrode 270 is formed up to the inner groove 194 of the auxiliary electrode 193 due to the thermal deposition angle of the metal material, and thus may be in contact with the auxiliary electrode 193 in the inner groove 194.

As shown in FIG. 1, the auxiliary electrode 193 is connected with the drain electrode DE, and the second electrode 270 may be connected with the drain electrode DE through the auxiliary electrode 193 and thus may receive a voltage.

That is, the second electrode 270 may be a pixel electrode receiving a pixel voltage from the transistor TFT.

As such, in the embodiment, the display device has a structure in which the transistor TFT and the second electrode 270 are connected in one pixel, and the first electrode 191 is connected with a neighboring pixel and thus receives a common voltage. Although it is not illustrated in FIG. 1 and FIG. 2, the first electrode 191 is connected with a neighboring another pixel, and the second electrode 270 is formed for each pixel and thus may receive a voltage by being connected with each transistor.

Figure 3:
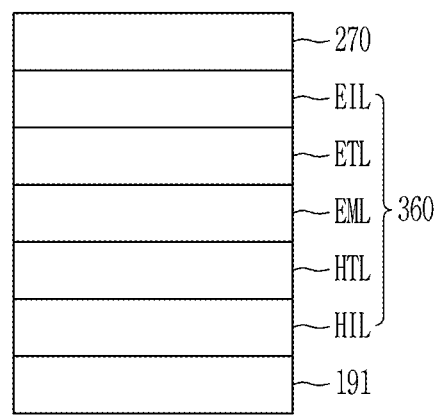
FIG. 3 schematically illustrates a stacked structure of a light emitting diode including a first electrode, a second electrode, and light emitting diode layer disposed between the first and second electrodes.

In this case, the stacked structure of the light emitting diode layer 360 may be a structure shown in FIG. 3. FIG. 3 schematically illustrates a stacked structure of the light emitting diode including the first electrode 191, the second electrode 270, and the light emitting diode layer 360 disposed between the two electrodes 191 and 270.

Referring to FIG. 3, the light emitting diode layer 360 may include a hole injection layer HIL, a hole transport layer HTL, an emission layer EML, an electron transport layer ETL, and an electron injection layer EIL. As shown in FIG. 3, the hole injection layer HIL and the hole transport layer HTL may be disposed between the first electrode 191 and the emission layer EML, and the electron transport layer ETL and the electron injection layer EIL may be disposed between the second electrode 270 and the emission layer EML.

The display device according to the embodiment includes an N-MOS transistor. In the case of a display device including a P-MOS transistor, there was a problem that high-speed driving over 120 Hz was not possible in high resolution mode. This is because the mobility of the P-MOS transistor is about 450 cm2/V/s, which is lower than the mobility of the N-MOS transistor, at about 1500 cm2/V/s. Accordingly, it is necessary to apply an N-MOS transistor to drive the display device at a high speed, but in this case, there is a problem that the element structure of the light emitting diode LED must be reversed. When the element structure of the light emitting diode LED is reversed in this way, the efficiency decreases due to the high dielectric constant of the electron injection layer EIL material and the driving voltage increases, and the position of the emission layer is close to the electrode such that the luminous efficiency may decrease due to an increase in quenching of excitons caused by surface plasmon polarization. However, in the display device according to the embodiment, the second electrode 270 is connected with the transistor instead of inverting the element structure of the light emitting diode LED in the display device including the N-MOS transistor.

In this case, as described with reference to FIG. 1 and FIG. 2, the second electrode 270 is connected with the drain electrode DE through the auxiliary electrode 193.

Thus, the display device according to the embodiment can be implemented as a high-speed driving display device without the inversion structure of the light emitting diode LED by controlling electron movement through N-MOS driving with the drain electrode DE of the transistor directly connected to the second electrode 270.

Next, a method for manufacturing the display device according to tan embodiment will be described in detail with reference to the accompanying drawings.

FIGS. 4, 5, 6, 7, 8, 9, and 10 are cross-sectional views of a manufacturing process of a display device according to an embodiment.

Figure 4:
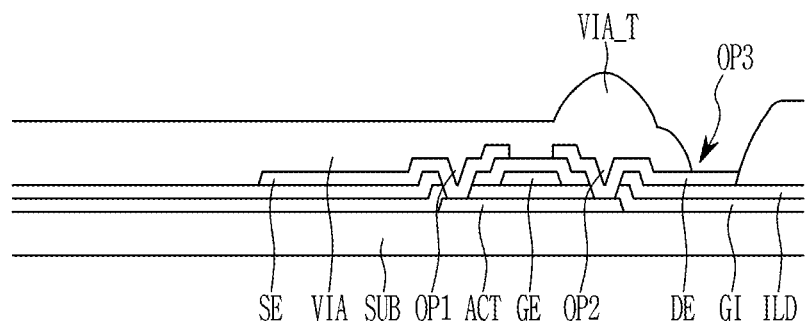
FIGS. 4, 5, 6, 7, 8, 9, and 10 are cross-sectional views of a manufacturing process of a display device according to an embodiment.

Referring to FIG. 4, a substrate SUB and a semiconductor layer ACT disposed on the substrate SUB are included. A gate insulating layer GI is disposed on the semiconductor layer ACT, and the gate electrode GE and the interlayer insulating layer ILD are disposed on the gate insulating layer GI. The source electrode SE and the drain electrode DE are disposed on the interlayer insulating layer ILD. Descriptions of the substrate SUB, the semiconductor layer ACT, the gate insulating layer GI, the gate electrode GE, the interlayer insulating layer ILD, the source electrode SE, and the drain electrode DE are the same as described with reference to FIG. 1 and FIG. 2, and therefore descriptions of the same constituent elements will be omitted for ease in explanation of the embodiment.

Referring to FIG. 4, the insulating layer VIA includes a third opening OP3 overlapping the drain electrode DE, and a curved protruding portion VIA_T disposed while being adjacent to the third opening OP3.

The third opening OP3 is a region where an auxiliary electrode 193, which will be described later, contacts the drain electrode DE, and the protruding portion VIA_T of the insulating layer VIA is a region where the auxiliary electrode 193 is going to contact the second electrode 270.

Figure 5:
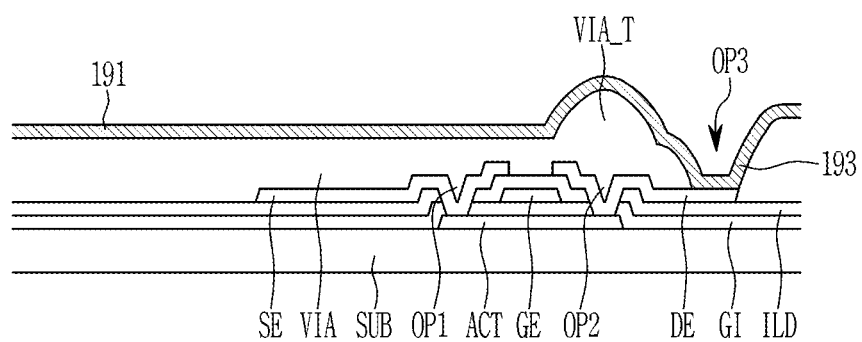

Next, referring to FIG. 5, a first electrode 191 is formed on the insulating layer VIA. The first electrode 191 may be formed in the top surface of the partitioning wall 350 and in the third opening OP3.

Figure 6:
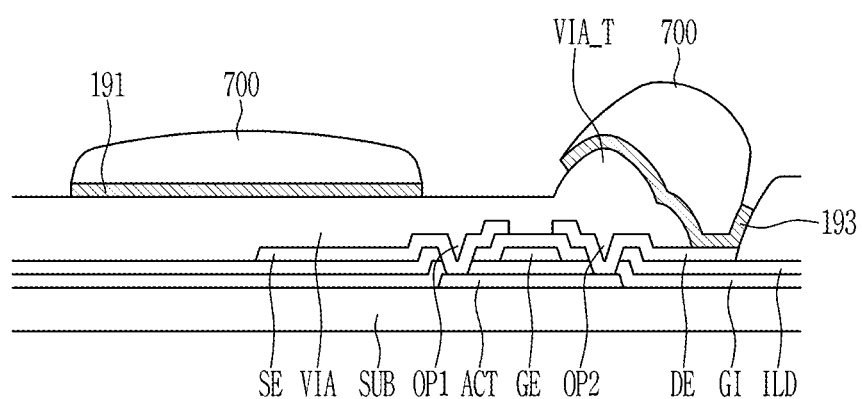

Next, referring to FIG. 6, a photoresist 700 is placed, and the first electrode 191 is etched such that the auxiliary electrode 193 is formed. As shown in FIG. 6, a part of the first electrode 191 is etched and thus the auxiliary electrode 193 is formed. The auxiliary electrode 193 contacts the drain electrode DE in the third opening OP3.

Figure 7:
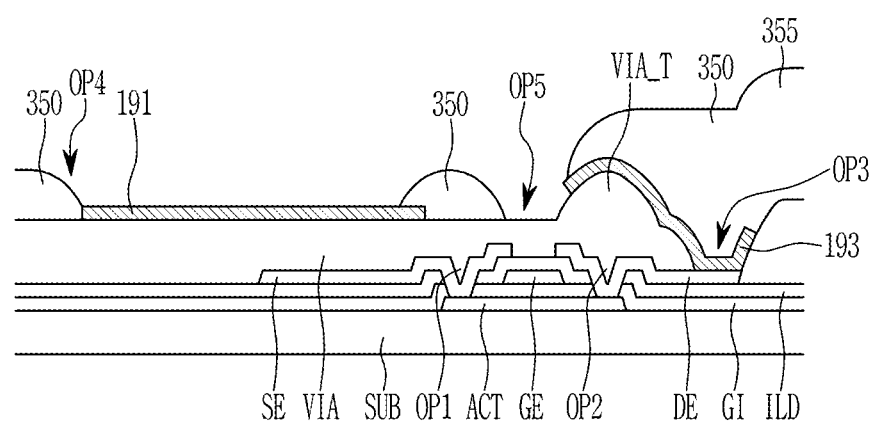

Next, referring to FIG. 7, a partitioning wall 350 is formed on the first electrode 191 and the auxiliary electrode 193. The partitioning wall 350 include a fourth opening OP4 overlapping the first electrode 191, and a fifth opening OP5 overlapping one edge of the auxiliary electrode 193. The fifth opening OP5 of the partitioning wall 350 may be disposed while being adjacent to the protruding portion VIA_T of the insulating layer VIA. A part of the partitioning wall 350 protrudes in a direction that is away from the substrate SUB such that a spacer 355 can be formed.

Figure 8:
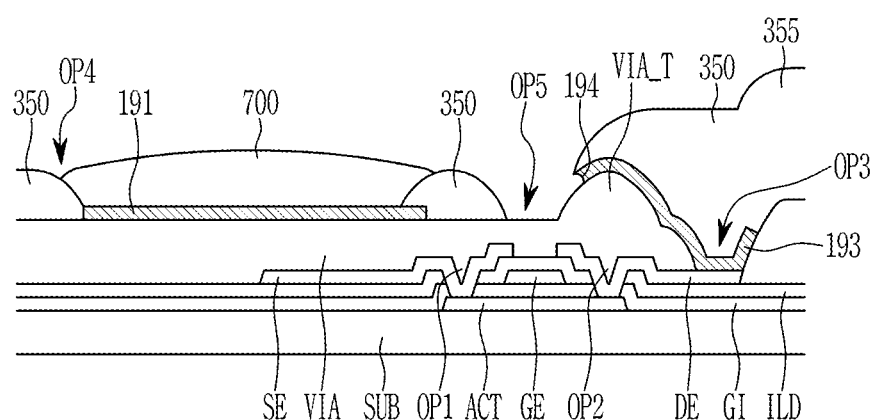

Next, referring to FIG. 8, the photoresist 700 that overlaps the fourth opening OP4 of the partitioning wall 350 is placed, and then one edge of the auxiliary electrode 193 is etched such that an inner groove 194 is formed. In such a process, an end of the auxiliary electrode 193 is etched such that the inner groove 194 is formed. That is, a cross-section of the edge of the auxiliary electrode 193 may be formed with a shape that is concave inwardly rather than being flat, and the second electrode 270 may contact the auxiliary electrode 193 in the inner groove 194 of the auxiliary electrode 193

Figure 9:
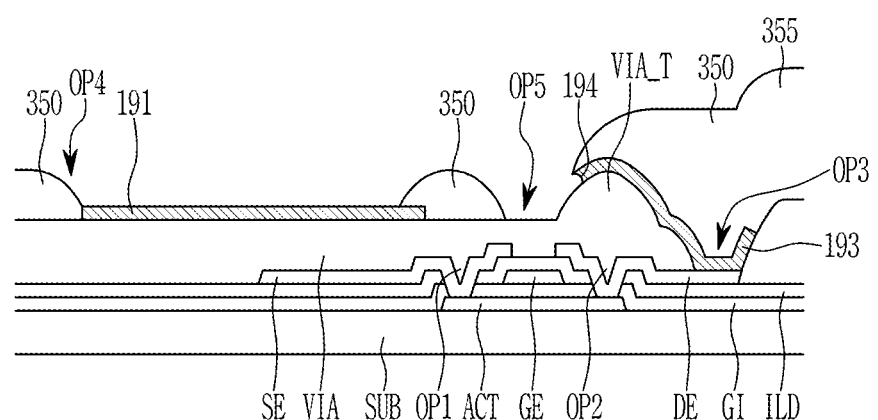

Next, referring to FIG. 9, the photoresist 700 is removed.

Figure 10:
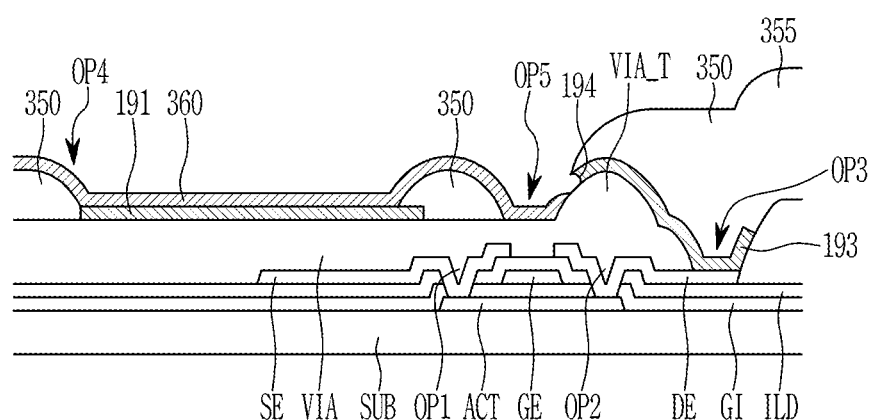

Next, referring to FIG. 10, a light emitting diode layer 360 is formed. The light emitting diode layer 360 may be disposed while contacting the first electrode 191 in the fourth opening OP4 of the partitioning wall 350, and may be disposed on the partitioning wall 350 and thus may be disposed in a fifth opening OP5 of the partitioning wall 350 as well. The light emitting diode layer 360 does not contact the auxiliary electrode 193. This is because that a deposition angle of the light emitting diode layer 360 is 40 degrees or more.

Figure 11:
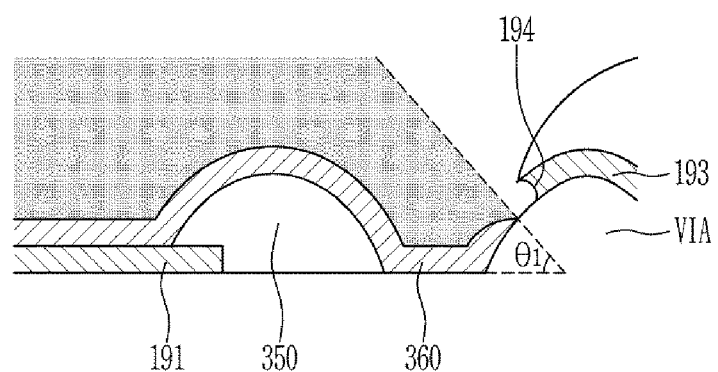
FIG. 11 illustrates a deposition angle of the light emitting diode layer in the fifth opening of the insulating layer.

FIG. 11 illustrates a deposition angle of the light emitting diode layer 360 in the fifth opening OP5 of the insulating layer VIA. As shown in FIG. 5, the deposition angle θ1 of the light emitting diode layer 360 may be about 40 degrees or more. Accordingly, the light emitting diode layer 360 is not formed in the inner groove 194 of the auxiliary electrode 193, and the light emitting diode layer 360 is formed so as to not contact the auxiliary electrode 193.

Next, the second electrode 270 is formed on the light emitting diode layer 360. The second electrode 270 is formed on the top surface of the emission layer, and is formed in the fifth opening OP5 of the insulating layer VIA. As shown in FIG. 1 and FIG. 2, the second electrode 270 contacts the auxiliary electrode 193 in the fifth opening OP5 of the insulating layer VIA. That is, although it will be described later, the second electrode 270 is formed up to the inner groove 194 of the auxiliary electrode 193 by the thermal deposition angle of the metal material, and may contact the auxiliary electrode 193.

Figure 12:
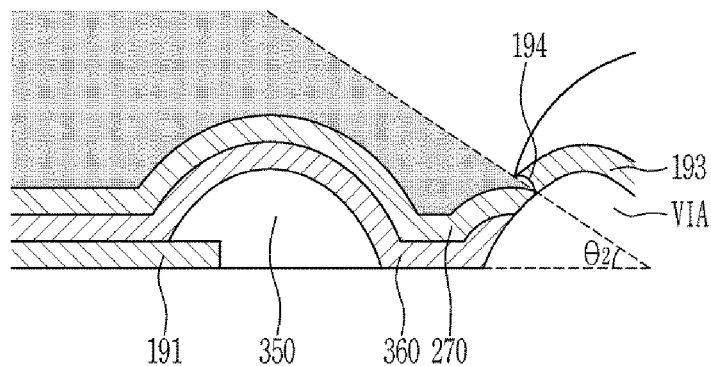
FIG. 12 illustrates a deposition angle of the second electrode in the fifth opening of the insulating layer.

FIG. 12 illustrates a deposition angle of the second electrode 270 in the fifth opening OP5 of the insulating layer VIA. As shown in FIG. 12, a deposition angle θ2 of the second electrode 270 may be about 20 degrees or less. Accordingly, since the second electrode 270 is deposited at a lower angle than the light emitting diode layer 360, a region in which the light emitting diode layer 360 is not formed may be formed. Thus, as shown in FIG. 1 and FIG. 2, the second electrode 270 is formed up to the inner groove 194 of the auxiliary electrode 193, and may directly contact the auxiliary electrode 193.

Figure 13:
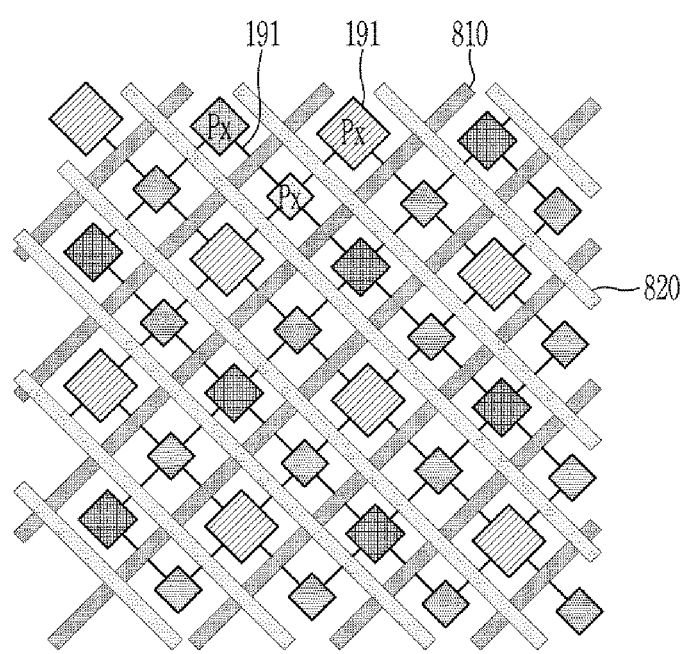
FIG. 13 and FIG. 14 schematically illustrate a process for forming the second electrode in each pixel of the display device.
Figure 14:
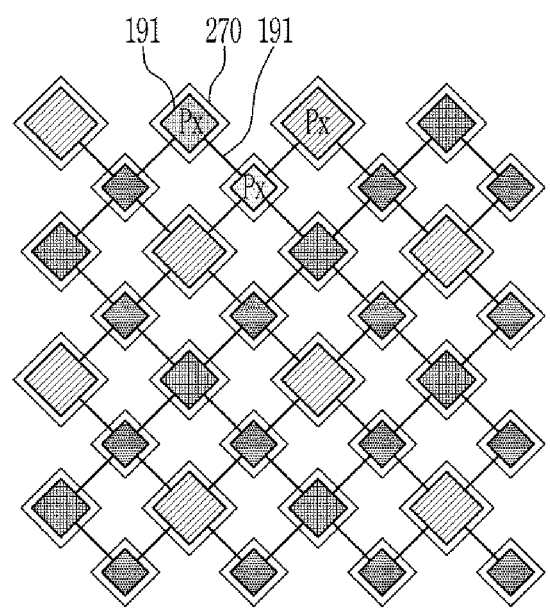

FIG. 13 and FIG. 14 schematically illustrate a process for forming the second electrode 270 in each pixel of the display device. Referring to FIG. 13, first electrodes 191 are disposed in a plurality of pixels PX, while connecting neighboring pixels. Layers that suppress forming of metal films (hereinafter, shortly referred to as metal suppression layers) 810 and 820 are formed between the respective pixels PX. A first metal suppression layer 810 is formed first, and then a second metal suppression layer 820 is formed crossing the first metal suppression layer 810.

Subsequently, the second electrode 270 is formed thereon. Since the second electrode 270 is not formed on the first metal suppression layer 810 and the second metal suppression layer 820, as shown in FIG. 14, the second electrode 270 separated by the pixel PX unit may be formed.

Figure 15:
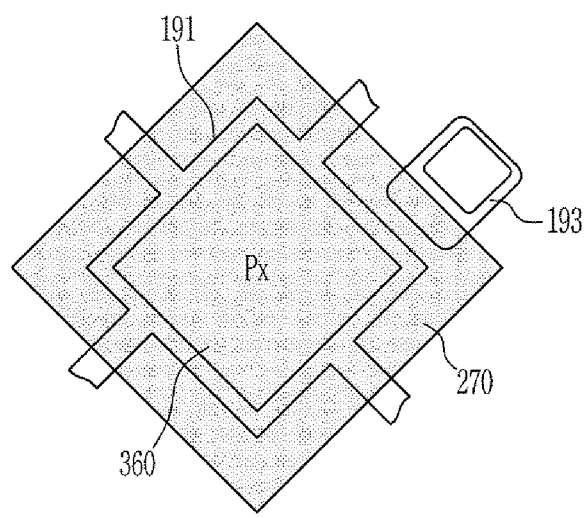
FIG. 15 schematically illustrates a configuration of the first electrode, the auxiliary electrode, the light emitting diode layer, and the second electrode for one pixel.

FIG. 15 schematically illustrates a configuration of the first electrode 191, the auxiliary electrode 193, the light emitting diode layer 360, and the second electrode 270 for one pixel. As shown in FIG. 15, the first electrode 191 is disposed while connecting neighboring pixels, and the auxiliary electrode 193 is formed in the same layer as the first electrode 191.

The light emitting diode layer 360 is disposed on the first electrode 191. The light emitting diode layer 360 may be disposed in each pixel PX. The second electrode 270 may also be separated and disposed for each pixel PX, and it may be connected to the auxiliary electrode 193 to receive a drain voltage.

As described above, the display device according to the embodiment controls the movement of electrons through N-MOS driving with the drain electrode DE of the transistor, which is directly connected to the second electrode 270, and a high-speed display without the inversion structure of the light emitting diode LED can be implemented.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate;
a transistor that is disposed on the substrate;
an auxiliary electrode that is connected with the transistor;
a first electrode that is disposed on a same layer as the auxiliary electrode;
an insulation layer that is disposed between the transistor and the first electrode,
a light emitting diode layer that is disposed on the first electrode; and
a second electrode that is disposed on the light emitting diode layer,
wherein the second electrode contacts the auxiliary electrode at a side surface thereof,
wherein the insulating layer comprises an opening that overlaps the transistor and a protruding portion that protrudes at a position adjacent to the opening, and
the auxiliary electrode is disposed in the protruding portion and the opening.

2. The display device of claim 1, wherein an inner groove is disposed at one edge of the auxiliary electrode, and the auxiliary electrode and the second electrode contact in the inner groove.

3. The display device of claim 1, wherein a cross-section of the protruding portion of the insulating layer is curved in a direction that is perpendicular to a plane of the substrate.

4. The display device of claim 1, wherein the transistor and the auxiliary electrode directly contact in the opening of the insulating layer.

5. The display device of claim 1, wherein the light emitting diode layer further comprises a hole transport layer, an emission layer, and an electron transport layer,
the hole transport layer is disposed between the emission layer and the first electrode, and
the electron transport layer is disposed between the emission layer and the second electrode.

6. The display device of claim 1, wherein the transistor comprises a semiconductor layer, a gate electrode, a source electrode, and a drain electrode, and
the semiconductor layer is an N-type.

7. The display device of claim 1, further comprising a partitioning wall that is disposed on the first electrode,
wherein the partitioning wall further comprises a first opening that overlaps the first electrode, and a second opening that is disposed while being adjacent to the protruding portion of the insulating layer.

8. The display device of claim 7, wherein
the light emitting diode layer is disposed in the first opening and the second opening of the partitioning wall, and on a top surface of the partitioning wall between the first opening and the second opening, and
the light emitting diode layer disposed in the second opening does not contact the auxiliary electrode.

9. The display device of claim 8, wherein
the second electrode is disposed on the top surface of the light emitting diode layer, and
the second electrode directly contacts the auxiliary electrode in the second opening.

10. A display device comprising:
a substrate;
a plurality of transistors that are disposed on the substrate;
a plurality of auxiliary electrodes that are respectively connected with the plurality of transistors;
a plurality first electrodes that are disposed on same layers as the plurality of auxiliary electrodes;
a plurality of light emitting diode layers that are respectively disposed on the plurality of first electrodes; and
a plurality of second electrodes each disposed in an island shape on each light emitting diode layer,
wherein the plurality of second electrodes respectively contact the plurality of auxiliary electrodes at side surfaces thereof, and
each of the plurality of first electrodes is connected with neighboring ones of the plurality of first electrodes.

11. The display device of claim 10, wherein each of the plurality of first electrodes receives a common voltage, and the wherein each of the plurality of second electrodes receives a pixel voltage.

12. The display device of claim 10, wherein
the light emitting diode layer further comprises a hole transport layer, an emission layer, and an electron transport layer,
the hole transport layer is disposed between the emission layer and the first electrode, and
the electron transport layer is disposed between the emission layer and the second electrode.

13. The display device of claim 10, wherein
the transistor comprises a semiconductor layer, a gate electrode, a source electrode, and a drain electrode, and
the semiconductor layer is an N-type.

14. The display device of claim 10, wherein
an inner groove is disposed at one edge of the auxiliary electrode, and
the auxiliary electrode and the second electrode contact in the inner groove.

\* \* \* \* \*